United States Patent
Kang

(10) Patent No.: US 9,311,973 B2
(45) Date of Patent: Apr. 12, 2016

(54) INPUT BUFFER FOR SEMICONDUCTOR MEMORY DEVICE AND FLASH MEMORY DEVICE INCLUDING THE SAME

(71) Applicant: Samsung Electronics Co., Ltd., Suwon-Si, Gyeonggi-Do (KR)

(72) Inventor: Kyoung-tae Kang, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/558,212

(22) Filed: Dec. 2, 2014

(65) Prior Publication Data

US 2015/0187423 A1    Jul. 2, 2015

(30) Foreign Application Priority Data

Dec. 26, 2013  (KR) .................. 10-2013-0163949

(51) Int. Cl.
*G11C 7/22* (2006.01)
*G11C 16/10* (2006.01)
*H03K 5/02* (2006.01)
*H03K 19/0185* (2006.01)
*G11C 16/08* (2006.01)
*G11C 16/30* (2006.01)
*G11C 5/14* (2006.01)
*G11C 7/06* (2006.01)
*G11C 7/10* (2006.01)
*H03F 1/02* (2006.01)
*G11C 29/02* (2006.01)

(52) U.S. Cl.
CPC  *G11C 7/22* (2013.01); *G11C 5/147* (2013.01); *G11C 7/06* (2013.01); *G11C 7/1078* (2013.01); *G11C 7/1084* (2013.01); *G11C 16/08* (2013.01); *G11C 16/10* (2013.01); *G11C 16/30* (2013.01); *H03K 5/023* (2013.01); *H03K 19/01855* (2013.01); *H03K 19/018521* (2013.01); *G11C 29/02* (2013.01); *H03F 1/0266* (2013.01)

(58) Field of Classification Search
CPC .......... G11C 7/22; G11C 16/08; G11C 16/10; G11C 29/02; G11C 16/30; H03F 1/0266; H03K 19/01855; H03K 5/023; H03K 19/018521
See application file for complete search history.

(56) References Cited

U.S. PATENT DOCUMENTS 4,038,567 A    7/1977  Lewis et al.
4,288,706 A    9/1981  Reese et al.

(Continued)

FOREIGN PATENT DOCUMENTS

JP    9-148911 A    6/1997
JP    2000-174604 A    6/2000

(Continued)

*Primary Examiner* — Richard Elms
*Assistant Examiner* — Ajay Ojha
(74) *Attorney, Agent, or Firm* — Harness, Dickey & Pierce, P.L.C.

(57) ABSTRACT

An input buffer includes an amplifier circuit configured to amplify an input signal and output an amplified signal to a first output node. The input signal is amplified according to a first bias voltage set, at a bias node, to a first level based on a power supply voltage and a reference voltage. The input buffer includes an output circuit configured to receive and buffer the amplified signal and output an output signal to a second output node. The input buffer includes a dynamic bias voltage generator configured to change the first bias voltage to a second level in response to a transition of the output signal.

20 Claims, 10 Drawing Sheets

(56) References Cited

U.S. PATENT DOCUMENTS

| | | | |
|---|---|---|---|
| 5,019,729 A * | 5/1991 | Kimura et al. | 326/71 |
| 6,414,517 B1 | 7/2002 | Kim et al. | |
| 6,549,049 B1 | 4/2003 | Hinterscher | |
| 7,142,022 B2 * | 11/2006 | Kang et al. | 327/53 |
| 7,362,144 B2 | 4/2008 | Shiah | |
| 8,502,566 B2 | 8/2013 | Kwon | |
| 2004/0066234 A1 * | 4/2004 | Luo et al. | 330/296 |
| 2006/0192538 A1 * | 8/2006 | Wang et al. | 323/282 |
| 2010/0117703 A1 | 5/2010 | Zhu et al. | |
| 2011/0317503 A1 * | 12/2011 | Ishikawa | 365/194 |
| 2015/0115918 A1 * | 4/2015 | Oikarinen | 323/280 |

FOREIGN PATENT DOCUMENTS

| | | |
|---|---|---|
| KR | 2003-0000608 A | 1/2003 |
| KR | 10-0630528 B1 | 9/2006 |
| KR | 10-0920841 B1 | 10/2009 |

\* cited by examiner

INPUT BUFFER FOR SEMICONDUCTOR MEMORY DEVICE AND FLASH MEMORY DEVICE INCLUDING THE SAME

CROSS-REFERENCE TO RELATED APPLICATIONS

This application claims the benefit of Korean Patent Application No. 10-2013-0163949, filed on Dec. 26, 2013, in the Korean Intellectual Property Office, the disclosure of which is incorporated herein in its entirety by reference.

BACKGROUND

The inventive concepts relate to an input buffer for a semiconductor memory device and/or a flash memory device including the same, and more particularly, to an input buffer for a semiconductor memory device, which improves an operating speed, and/or a flash memory device including the same.

In a semiconductor memory device, an input buffer receives a clock signal, an address signal, or a command signal, converts the received signal into an internal signal, and supplies the internal signal to each circuit block of the semiconductor memory device. The input buffer receives, amplifies, and buffers an unstable or low-level input signal which is received by the semiconductor memory device.

As an operating speed of a memory increases, a frequency of a signal input to the input buffer becomes higher. In addition, a period of a signal processed by the input buffer decreases. Therefore, a signal is likely to transition to another logic state before reaching a sufficient level. Accordingly, the performance of an input buffer is becoming important for achieving a high operating speed of a semiconductor memory device.

SUMMARY

The inventive concepts provide an input buffer for a semiconductor memory device and/or a flash memory device including the same, and more particularly, provide an input buffer for a semiconductor memory device, which enhances a transition speed of an amplified signal of the input buffer to improve an operating speed, and/or a flash memory device including the same.

According to at least one example embodiment, an input buffer includes an amplifier circuit configured to amplify an input signal and output an amplified signal to a first output node. The input signal is amplified according to a first bias voltage set, at a bias node, to a first level based on a power supply voltage and a reference voltage. The input buffer includes an output circuit configured to receive and buffer the amplified signal and output an output signal to a second output node. The input buffer includes a dynamic bias voltage generator configured to change the first bias voltage to a second level in response to a transition of the output signal.

According to at least one example embodiment, the amplifier circuit includes at least one amplifier that is configured to receive the input signal and the reference voltage and amplify a difference between the input signal and the reference voltage to generate the amplified signal.

According to at least one example embodiment, the amplifier circuit comprises a current mirror, an input circuit, and a first output node. The current mirror includes at least two transistors configured to operate as a constant-current source. The input circuit includes at least two transistors configured to receive the input signal and the reference voltage, respectively. The first output node is configured to output a node voltage, as the amplified signal, according to a first current supplied from the current mirror and a second current flowing through the transistor that receives the input signal in the input circuit.

According to at least one example embodiment, the at least two transistors in the input circuit are of a first transistor type, and the at least two transistors in the current mirror are of a second transistor type different from the first transistor type.

According to at least one example embodiment, if the output signal is constant, the dynamic bias voltage generator is configured to change the bias voltage from the second level to the first level.

According to at least one example embodiment, the amplifier circuit includes a first amplifier including a first current mirror and a first input circuit, the first current mirror including a diode-connected PMOS transistor, the first input circuit including at least two NMOS transistors gated by the input signal and the reference voltage, respectively. The amplifier circuit includes a second amplifier including a second current mirror and a second input circuit, the second current mirror including a diode-connected NMOS transistor, the second input circuit including at least two PMOS transistors gated by the input signal and the reference voltage, respectively. The output circuit is connected to the first output node, the first output node is connected to the first and second amplifiers, the output circuit includes resistors and an odd number of inverters, and the resistors are connected in parallel to the inverters, and the dynamic bias generator includes a capacitor connected between the second output node and a bias node of one of the first and second amplifiers.

According to at least one example embodiment, the output circuit includes at least one inverter connected to the first output node. The output circuit is configured to receive the amplified signal from the amplifier circuit, and output the output signal such that a phase of the output signal is opposite to a phase of the amplified signal.

According to at least one example embodiment, the dynamic bias voltage generator includes at least one capacitor connected in parallel between the bias node and the second output node.

According to at least one example embodiment, if the input signal transitions from a logic low level to a logic high level, the dynamic bias voltage generator is configured to generate a positive dynamic bias voltage and provide the positive dynamic bias voltage to the amplifier circuit.

According to at least one example embodiment, the positive dynamic bias voltage is an AC voltage, and the dynamic voltage bias generator is configured to apply the AC voltage to the bias node to change the first bias voltage.

According to at least one example embodiment, if the input signal transitions from a logic high level to a logic low level, the dynamic bias voltage generator is configured to generate a negative dynamic bias voltage and provide the negative dynamic bias voltage to the amplifier circuit.

According to at least one example embodiment, a flash memory device includes a clock buffer configured to buffer a clock signal from a memory controller. The flash memory device includes a command buffer configured to buffer a command signal, an address buffer configured to buffer an address signal, and a data buffer configured to buffer a data signal. At least one of the clock buffer, the command buffer, the address buffer and the data buffer includes an amplifier circuit, an output circuit, and a dynamic bias voltage generator. The amplifier circuit is configured to amplify an input signal and output an amplified signal to a first output node, the input signal being amplified according to a first bias voltage set, at a bias node, to a first level based on a power supply voltage and a reference voltage. The output circuit is configured to receive and buffer the amplified signal and output an output signal to a second output node. The dynamic bias voltage generator is configured to change the first bias voltage to a second level in response to a transition of the output signal.

According to at least one example embodiment, the amplifier circuit includes a current mirror an input circuit and a first output node. The current mirror includes at least two transistors configured to operate as a constant-current source. The input circuit includes at least two transistors configured to receive the input signal and the reference signal, respectively. The first output node is configured to output a node voltage, as the amplified signal, according to a first current supplied from the current mirror and a second current flowing through the transistor that receives the input signal in the input circuit.

According to at least one example embodiment, the dynamic bias voltage generator includes at least one capacitor connected in parallel between the bias node and the second output node.

According to at least one example embodiment, if the input signal transitions from a logic low level to a logic high level, at least one of the clock buffer, the command buffer, the address buffer and the data buffer is configured to generate a positive dynamic bias voltage and provide the positive dynamic bias voltage to the current mirror to increase the first bias voltage from the first level to a higher level than the first level. If the input signal transitions from the logic high level to the logic low level, at least one of the clock buffer, the command buffer, the address buffer and the data buffer is configured to generate a negative dynamic bias voltage and provide the negative dynamic bias voltage to the current mirror to decrease the first bias voltage from the first level to a lower level than the first level.

According to at least one example embodiment, an input buffer includes at least one amplifier configured output an amplified signal to an output node based on an input signal, a reference signal, and a filtered signal. The input signal has a first phase, and the first amplified signal has a second phase opposite to the first phase. The input buffer includes an output circuit configured to invert the first amplified signal to output an output signal having the first phase. The filter circuit is configured to filter a component of the output signal and apply the filtered signal to the at least one amplifier.

According to at least one example embodiment, the at least one amplifier includes a current mirror and an input circuit, the current mirror being configured to generate a current based on the reference signal, the input signal, and the filtered signal. The component is a direct current (DC) component.

According to at least one example embodiment, the filter circuit is configured to apply the filtered signal to the at least one amplifier as a positive voltage signal if the input signal transitions from a logic low level to a logic high level. The filter circuit is configured to apply the filtered signal to the at least one amplifier as a negative voltage signal if the input signal transitions from a logic high level to a logic low level.

According to at least one example embodiment, the filter circuit is configured to apply the filtered signal to the at least one amplifier during a time period in which the output signal transitions between logic levels.

According to at least one example embodiment, the at least one amplifier is a plurality of amplifiers configured to output amplified signals to the output node, the amplified signals being based on the input signal and the reference signal.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
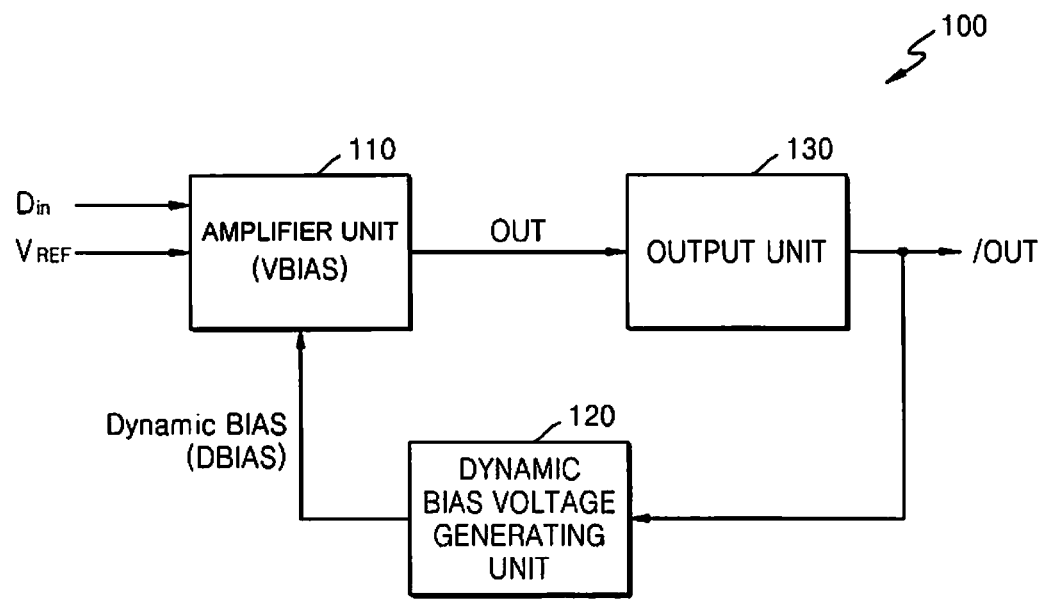
FIG. 1 is a diagram illustrating an input buffer according to at least one example embodiment of the inventive concepts.

Inventive concepts will now be described more fully with reference to the accompanying drawings, in which example embodiments of are shown. These example embodiments are provided so that this disclosure will be thorough and complete, and will fully convey inventive concepts of to those of ordinary skill in the art. Inventive concepts may be embodied in many different forms with a variety of modifications, and a few example embodiments will be illustrated in drawings and explained in detail. However, this should not be construed as being limited to example embodiments set forth herein, and rather, it should be understood that changes may be made in these example embodiments without departing from the principles and spirit of inventive concepts, the scope of which are defined in the claims and their equivalents. Like numbers refer to like elements throughout. In the drawings, the thicknesses of layers and regions are exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., electronic imaging systems, image processing systems, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible or non-transitory machine readable mediums for storing information. The term "computer-readable medium" may include, but is not limited to, portable or fixed storage devices, optical storage devices, and various other tangible or non-transitory mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

FIG. 1 is a diagram illustrating an input buffer 100 according to at least one example embodiment of the inventive concepts.

Referring to FIG. 1, the input buffer 100 for a semiconductor memory device includes an amplifier unit (or amplifier circuit) 110, a dynamic bias voltage generating unit (or dynamic bias voltage generator, or filter circuit) 120, and an output unit (or output circuit) 130. The amplifier unit 110 receives an input signal Din and a reference voltage VREF and amplifies a difference between the two signals so as to detect the input signal Din. The output unit 130 may reduce (or alternatively, prevent) changes in a signal from occurring due to process, voltage, and temperature (PVT) variation. The output unit 130 receives and buffers an amplified signal OUT from the amplifier unit 110 and outputs an inverted signal as an output signal /OUT. The dynamic bias voltage generating unit 120 detects a change in the output signal /OUT of the output unit 130 when the output signal /OUT transitions from a low level to a high level or from the high level to a low level, generates an alternating current (AC) voltage, and provides the AC voltage to the amplifier unit 110 as a dynamic bias voltage DBIAS. Furthermore, an input detection unit (not illustrated) may be further included which detects a logic level of the output signal /OUT of the output unit 130.

The dynamic bias voltage DBIAS provided from the dynamic bias voltage generating unit 120 to the amplifier unit 110 may raise or lower a first level of a first bias voltage VBIAS which is preset in the amplifier unit 110. The changed level may be referred to as a second level. When the output signal /OUT of the output unit 130 transitions from a low level to a high level or from the high level to the low level, the first bias voltage VBIAS previously set in the amplifier unit 110 may change. A transition speed of the output signal of the output unit 130 may be enhanced by using the dynamic bias voltage DBIAS to adjust the first bias voltage VBIAS set in the amplifier unit 110 and by controlling a magnitude of a current supplied by a constant-current source included in the amplifier unit 110.

Figure 2:
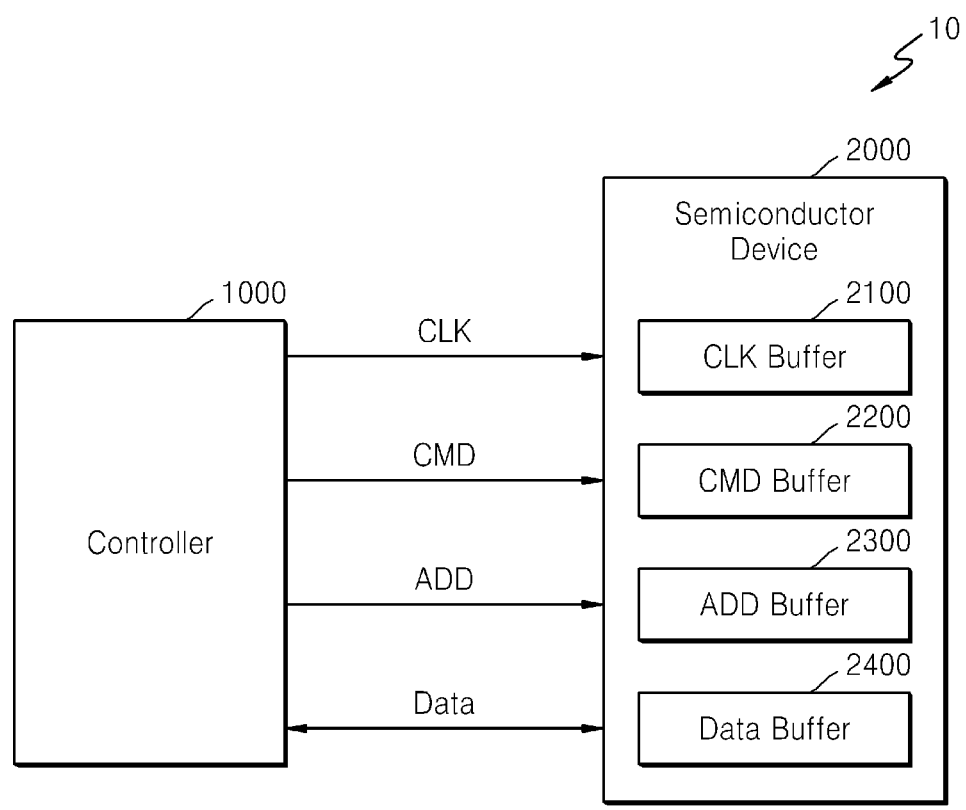
FIG. 2 is a block diagram illustrating a semiconductor system including a semiconductor memory device according to at least one example embodiment of the inventive concepts.

FIG. 2 is a block diagram of a semiconductor system 10 including a semiconductor device according to at least one example embodiment of the inventive concepts.

Referring to FIG. 2, the semiconductor system 10 may include a controller 1000 and a semiconductor device 2000. At least one of buffers of FIG. 2 may be implemented similar to the input buffer 100 of FIG. 1. The semiconductor device 2000 may be applied to various devices that are manufactured through semiconductor processes to perform various functions. As an example, the semiconductor device 2000 may be a memory device. In this case, the controller 1000 may be a memory controller which controls operation of the memory device. Example embodiments of the inventive concepts are described below based on the assumption that the controller 1000 is a memory controller and the semiconductor device 200 is a semiconductor memory device.

The controller 1000 provides various control signals to the semiconductor device 2000 to control operation of the semiconductor device 2000. For example, the controller 1000 may provide a command CMD, an address ADD, a clock signal CLK, and/or a data signal DATA to the semiconductor memory device 2000 and access data of a memory cell array.

The semiconductor device 2000 may include a clock buffer 2100 that buffers the clock signal CLK, a command buffer 2200 that buffers the command signal CMD, an address buffer 2300 that buffers the address signal ADD, and a data buffer 2400 that transmits and receives the data signal. The data buffer 2400 may include a reception buffer that receives a data signal DATA from the outside upon a data write operation and an output buffer that provides a data signal DATA to the outside upon a data read operation.

At least one of the clock buffer 2100, the command buffer 2200, the address buffer 2300, and the data buffer 2400 may be implemented the same as or similar to the input buffer 100 of FIG. 1. Therefore, at least one of the clock buffer 2100, the command buffer 2200, the address buffer 2300, and the data buffer 2400 may include an amplifier unit that amplifies a difference between an input signal and a reference voltage to generate an amplified signal and an output unit that receives and buffers the amplified signal, improves performance of the signal, and outputs the signal as an output signal. For example, the data buffer 2400 may include, as the amplifier unit, a current mirror that operates as a constant-current source and an input unit that receives the input signal and the reference signal. The input unit and the current mirror may be variously configured. A relevant example will be described below.

According to at least one example embodiment of the inventive concepts, the data buffer 2400 may further include a dynamic bias voltage generating unit that generates a dynamic bias voltage DBIAS for controlling a preset first bias voltage VBIAS of the amplifier unit. The level of the first bias voltage VBIAS which is set in the amplifier unit may be raised or lowered when the dynamic bias voltage DBIAS generated by the dynamic bias voltage generating unit is provided. Therefore, the speed of the semiconductor device may be enhanced by increasing the transition speed of the output signal. The dynamic bias voltage generating unit may be applicable to other buffers, that is, the clock buffer 2100, the command buffer 2200, and the address buffer 2300 may be implemented in the same manner as or a manner similar to that of the data buffer 2400.

Figure 3:
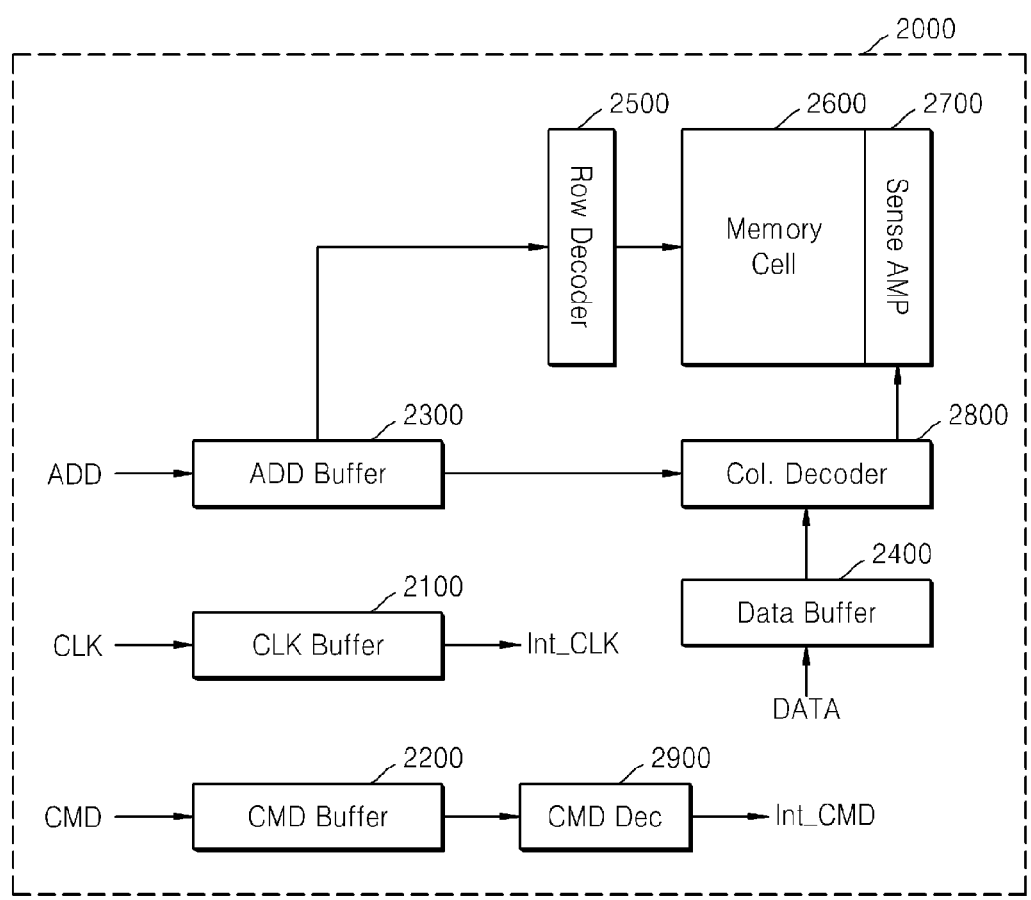
FIG. 3 is a block diagram illustrating an implementation of a semiconductor memory device according to at least one example embodiment of the inventive concepts.

FIG. 3 is a block diagram illustrating an implementation of a semiconductor device according to at least one example embodiment of the inventive concepts. Referring to FIG. 3, the semiconductor device 2000 according to at least one example embodiment of the inventive concepts may include a clock buffer 2100 that receives and buffers a clock signal CLK and outputs a buffered clock signal Int_CLK to the semiconductor device. The semiconductor device 2000 may include a command buffer 2200 that receives and buffers a command signal CMD, and a command decoder 2900 that decodes the buffered command signal and generates an internal command Int_CMD. The semiconductor device 2000 may include an address buffer 2300 that buffers an address signal ADD. The semiconductor device 2000 may further include a row decoder 2500 and a column decoder 2800 that receive the buffered address signal and select a memory cell array 2600. The semiconductor device 2000 may include a data buffer 2400 that receives and buffers a data signal DATA and provides the buffered data signal to the column decoder 2800, and a sense amplifier 2700 that amplifies read data and write data.

The command signal CMD, the address signal ADD, the clock signal CLK and the data signal DATA may be provided from the outside through different transmission lines. Therefore, the configuration including the amplifier unit and the output unit according to at least one example embodiment of the inventive concepts may be applied to at least one of the clock buffer 2100, the command buffer 2200, and the data buffer 2400. The data buffer 2400 is taken as an example. The data buffer 2400 further includes a dynamic bias voltage generating unit. The dynamic bias voltage generating unit generates a dynamic bias voltage when the output signal of the output unit changes. When the dynamic bias voltage DBIAS generated by the dynamic bias voltage generating unit is provided, the first level of the first bias voltage VBIAS that is preset in the amplifier unit may be increased or decreased. The changed level may be referred to as a second level. The operating speed of the semiconductor device may be enhanced by controlling a magnitude of a current supplied by a constant-current source in the amplifier unit.

Figure 4:
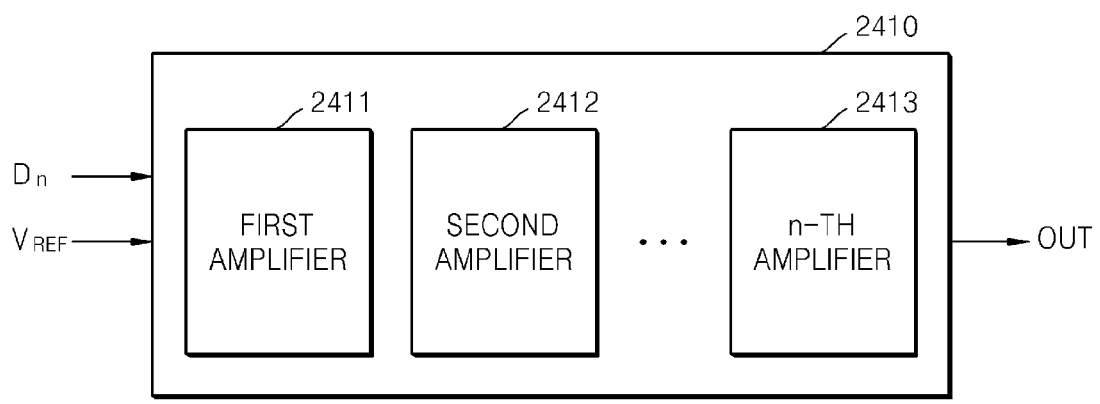
FIG. 4 is a block diagram illustrating an amplifier unit of FIG. 1 according to at least one example embodiment of the inventive concepts.

FIG. 4 is a block diagram illustrating an amplifier unit 2410 according to at least one example embodiment of the inventive concepts. The amplifier unit (or amplifier circuit) 2410 may include one or more amplifiers that amplify a difference between an input signal Din input from the outside and a reference voltage VREF. It should be understood that the configuration of FIG. 4 is applicable to the amplifier unit 110 of FIG. 1.

Referring to FIG. 4, the amplifier unit may include a first amplifier 2411, a second amplifier 2412, . . . , an N-th amplifier 2413, the first output nodes of which may be connected to one another. Details of the connection between the first amplifier 2411 to the Nth amplifier are discussed later with reference to FIGS. 5-8.

The first amplifier 2411 may include an input unit (or input circuit) that receives an input signal Din and a reference signal VREF and a current mirror that operates as a constant-current source. As an example, the input unit may include two N-type transistors NMOS, the drain terminals of which may be connected to the current mirror. The source terminals of the NMOS transistors may be grounded, and the gate terminals of the NMOS transistors may respectively receive the input signal Din and the reference signal VREF. The current mirror may include two P-type transistors PMOS, the gate terminals of which may be commonly connected to a bias node. The lower end of the current mirror may be connected to the input unit.

According to at least one example embodiment, the input unit (or input circuit) of the second amplifier 2412 may include two P-type transistors PMOS, the source terminals of which may be connected to the current mirror. The drain terminals of the PMOS transistors may be connected to a power supply voltage VDD, and the gate terminals of the PMOS transistors may respectively receive the input signal Din and the reference signal VREF. The current mirror may include two N-type transistors NMOS, the gate terminals of which may be commonly connected to a bias node. The upper end of the current mirror may be connected to the input unit.

Amplified signals are output at the first output node of the first amplifier 2411 and the first output node of the second amplifier 2412, and by connecting the first output node of the first amplifier 2411 and the first output node of the second amplifier 2412 to each other, the first amplifier 2411 may output an amplified signal OUT having a higher transition speed than that of the input signal when the input signal transitions from a low level to a high level. Likewise, the second amplifier 2412 may output an amplified signal OUT having a higher transition speed than that of the input signal when the input signal transitions from the high level to the low level. The two amplifiers may generate the amplified signal OUT that transitions from the low level to the high level or from the high level to the low level at a high transition speed. By connecting the respective first output nodes of a plurality of amplifiers to one another, the amplified signal transitions from the low level to the high level or from the high level to the low level at a high speed through the amplifiers.

Figure 5:
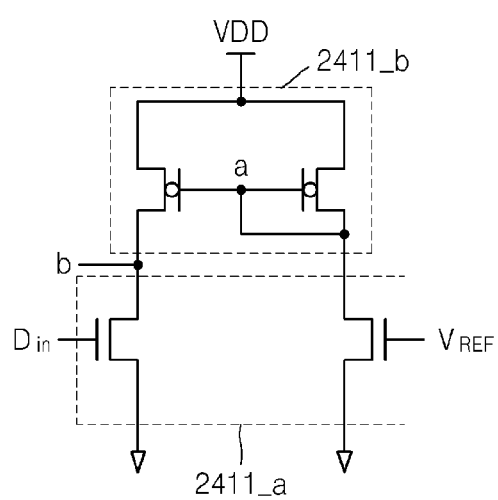
FIGS. 5 and 6 are example diagrams illustrating a first amplifier and a second amplifier of FIG. 4.
Figure 6:
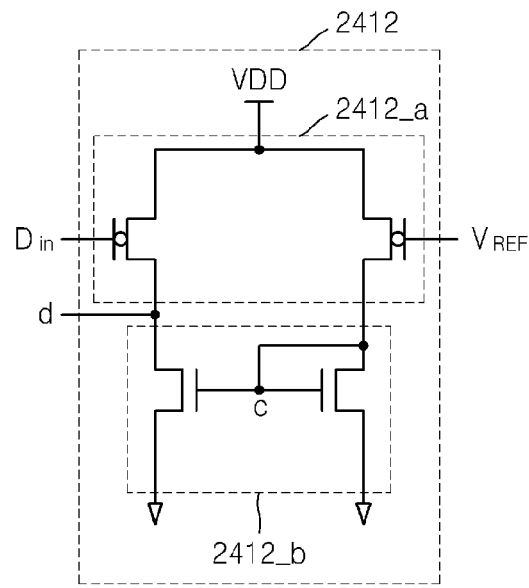

FIGS. 5 and 6 are detailed circuit diagrams illustrating the first amplifier 2411 and the second amplifier 2412 of FIG. 4 according to at least one example embodiment of the inventive concepts.

The first amplifier 2411 may include an input unit (or input circuit) 2411_a that receives an input signal Din and a reference signal VREF and a current mirror 2411_b that operates as a constant-current source. The input unit 2411_a may include two N-type transistors NMOS, the drain terminals of which may be connected to the current mirror, the source terminals of which may be grounded, and the gate terminals of which may respectively receive the input signal Din and the reference signal VREF. An amplified signal obtained by amplifying a difference between the input signal Din and the reference voltage VREF may be output at a first output node b. In this case, the amplified signal may have a phase opposite to the phase of the input signal Din.

The current mirror 2411_b may include two P-type transistors PMOS. The gate terminals of the P-type transistors PMOS may be commonly connected to a bias node a. The lower part of the current mirror 2411_b may be connected to the input unit 2411_a. A first bias voltage VBIAS that is a bias voltage maintained at a constant level may be set at the bias node a connected to the drain node of the N-type transistor NMOS to which the reference voltage VREF is input. This enables stable currents, the magnitudes of which are equal to each other, to flow through all amplifier stages during various amplification operations, allowing the amplifier unit 2410 to operate at a high operating speed in a saturated state.

The set first bias voltage VBIAS may be controlled by the reference voltage VREF and the power supply voltage VDD. Therefore, currents flowing from the drain terminals to the source terminals of the transistors of the current mirror 2411_b become equal in magnitude to each other. That is, unless the power supply voltage VDD or the reference voltage VREF changes, the first bias voltage VBIAS maintains a constant level and therefore, the magnitude of currents flowing from the drain terminals to the source terminals of the transistors of the current mirror 2411_b may remain constant.

The second amplifier 2412 may include an input unit (or input circuit) 2412_a that receives an input signal Din and a reference signal VREF, and a current mirror 2412_b that operates as a constant-current source. The input unit 2412_a may include two P-type transistors PMOS, the source terminals of which may be connected to the input unit 2412_a, the drain terminals of which may be connected to a power supply voltage VDD, and the gate terminals of which may respectively receive the input signal Din and the reference signal VREF. In this case, an amplified signal generated by amplifying a difference between the input signal Din and the reference voltage VREF may be output at a first output node 'd'. In this case, the amplified signal OUT may have a phase opposite to the phase of the input signal Din.

The current mirror 2412_b may include two N-type transistors NMOS, the gate terminals of which may be commonly connected to a bias node c, the source terminals of which may be grounded, and the drain terminals of which may be connected to the input unit 2412_a. A first bias voltage VBIAS that is a bias voltage maintained at a constant level may be set at the bias node c connected to the drain node of the P-type transistor PMOS to which the reference voltage VREF is input.

Therefore, currents flowing from the drain terminals to the source terminals of the transistors of the current mirror 2412_b become equal in magnitude to each other as in the current mirror 2411_b of the first amplifier 2411. Unless the power supply voltage VDD or the reference voltage VREF changes, the set first bias voltage VBIAS maintains a constant level and therefore, the magnitude of currents flowing from the drain terminals to the source terminals of the transistors of the current mirror 2412_b may remain constant.

Figure 7:
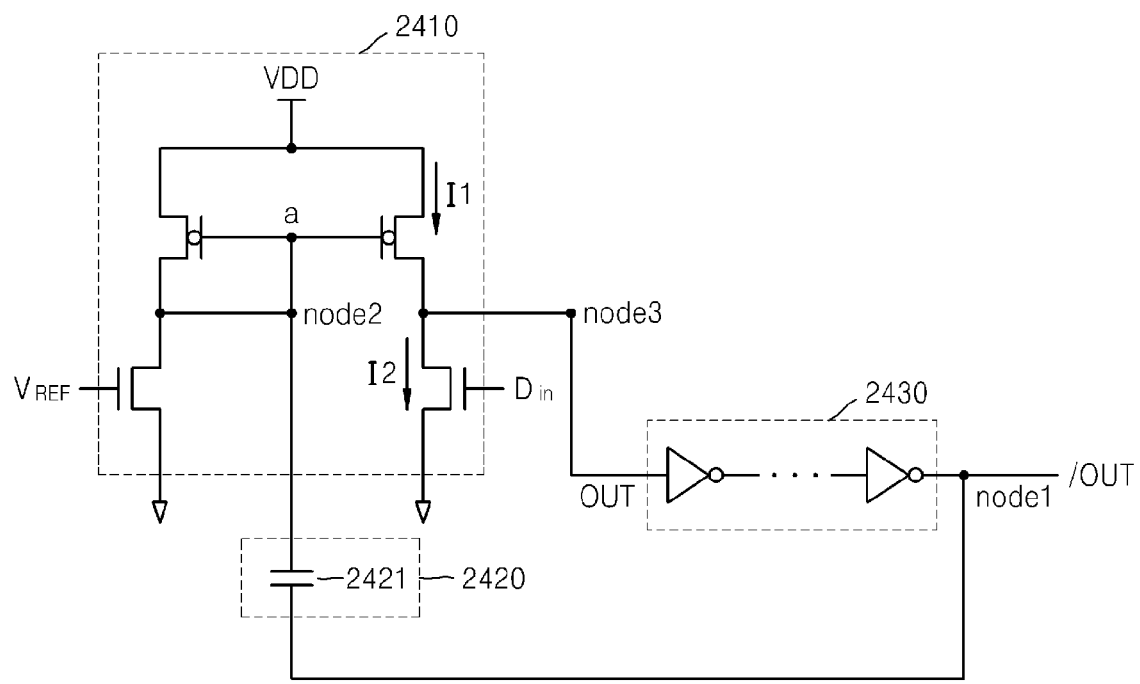
FIGS. 7 and 8 are circuit diagrams implementing the input buffer of FIG. 1.
Figure 8:
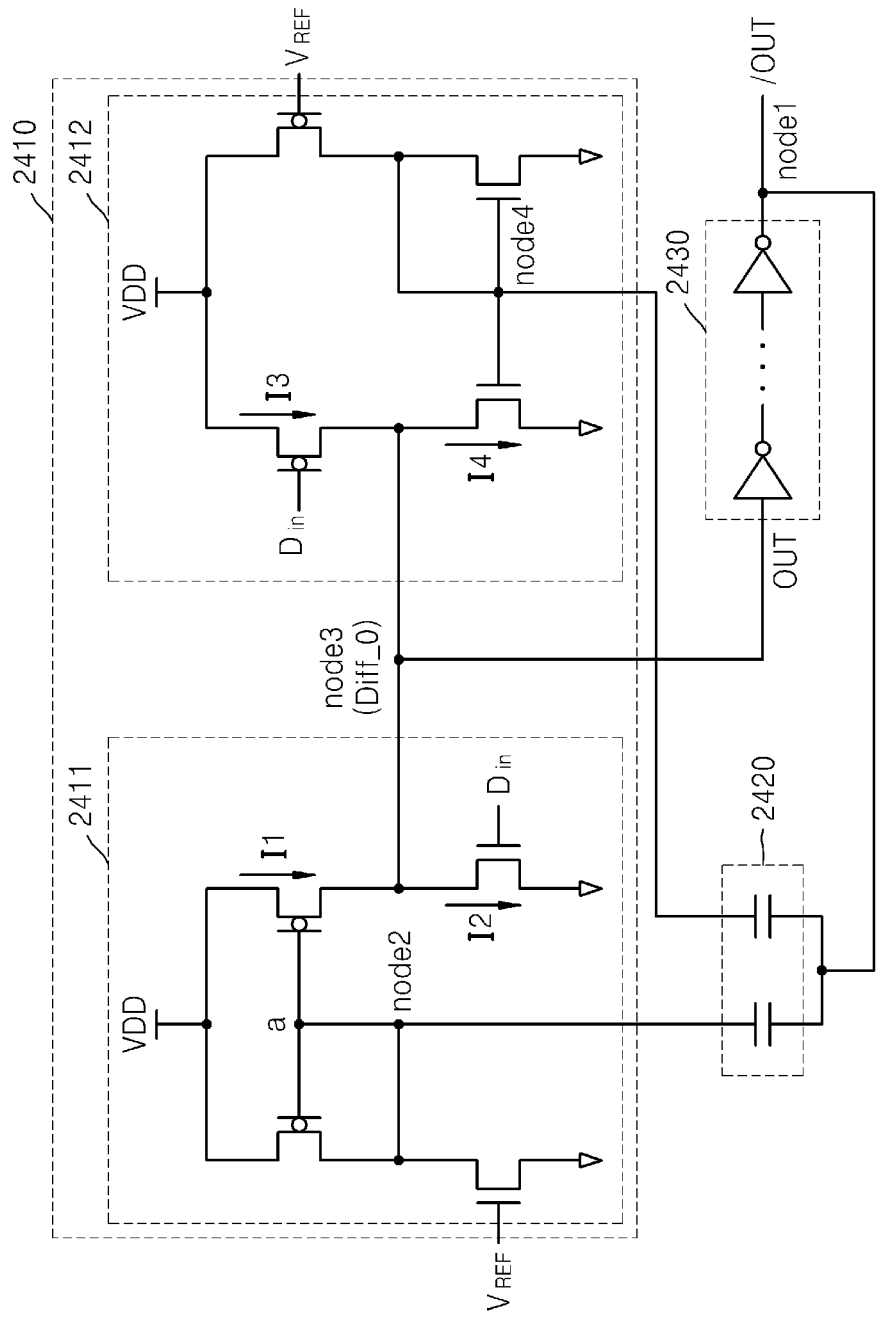

FIGS. 7 and 8 are circuit diagrams illustrating detailed circuits according to at least one example embodiment of the inventive concepts.

Referring to FIG. 7, an amplifier unit (or amplifier circuit) 2410 includes a single amplifier with an input unit (or input circuit) and a current mirror. The input unit may include N-type transistors, and the current mirror may include P-type transistors. The current mirror may receive a power supply voltage VDD supplied from the outside. A node 'a' to which the gates of the P-type transistors PMOS are connected and a drain terminal of the N-type transistor NMOS to which a reference voltage VREF is input are commonly connected to a bias node node2. A first bias voltage VBIAS of a constant level which is caused by the reference voltage VREF and the power supply voltage VDD may be set at the bias node node2. Due to the first bias voltage, the transistor may output an amplified signal OUT which transitions at a high speed while in a saturated state.

The output unit (or output circuit) 2430 may be connected to a first output node node3 of the amplifier unit 2410, and an amplified signal OUT may be received by the output unit 2430. The output unit 2430 may be configured as one inverter or may be configured as two or more inverters connected serially or furthermore, as one or more resistors connected in parallel to the inverters. The dynamic bias voltage generating unit (or dynamic bias voltage generator or filter circuit) 2420 may be connected to a second output node node1 of the output unit 2430. The dynamic bias voltage generating unit 2420 may receive an output signal /OUT. The dynamic bias voltage generating unit 2420 may be connected to the bias node node2 of the amplifier unit 2410 to provide a generated dynamic bias voltage DBIAS to the bias node node2. The dynamic bias voltage generating unit 2420 may include one or more capacitors. An example of the dynamic bias voltage generating unit 2420 including a single capacitor is illustrated in FIG. 7. A value of the one or more capacitors may be selected by a user and/or selected based on empirical data.

When a voltage level of the input signal Din is at a constant low voltage level or a constant high voltage level, a first current I1 of the P-type transistor of the current mirror may be constant due to the first bias voltage VBIAS of a constant level. Therefore, the amplified signal OUT may be maintained at a constant voltage level. Since the dynamic bias voltage generating unit 2420 does not pass a signal having a voltage maintained at a constant level, that is, a direct-current (DC) signal, the dynamic bias voltage DBIAS may not be generated.

Since a gate voltage of the N-type transistor to which the input signal Din is input increases when the input signal Din transitions from a low voltage level to a high voltage level, a second current I2 flowing through the N-type transistor to which the input signal Din is input may increase. At this time, however, a dynamic bias voltage has not yet been provided to the node node2 of the amplifier unit 2410 by the dynamic bias voltage generating unit 2420. Therefore, the first current I1 having a constant level may still flow due to the first bias voltage VBIAS of a constant level.

The amplified signal OUT output at a node node3 has a phase opposite to the phase of the input signal Din. Thus, when the input signal Din transitions from a low level to a high level, the amplified signal OUT is expected to transition from a high level to a low level. In this case, the level transition speed of the amplified signal OUT may decrease due to the first current component I1.

The amplified signal OUT which is output from the amplifier unit 2410 at the node node3 may be input to the output unit 2430. The output unit 2430 may invert the phase of the amplified signal and output an output signal /OUT at the node node1. Furthermore, the output unit 2430 may further include one or more resistors connected in parallel to the inverters, thereby providing a signal which may mitigate PVT variations (i.e., variations caused by process, voltage and temperature) and improve signal quality using negative feedback effect.

The output signal /OUT having the same phase as the input signal Din may be input to the dynamic bias voltage generating unit (or filter circuit) 2420. A capacitor of the dynamic bias voltage generating unit 2420 minimizes a loss in a high frequency region and outputs a signal. In this case, a DC component of the signal from node1 does not pass through the capacitor and an AC component of the signal from node1 easily passes through the capacitor. In other words, the voltage generating unit (or filter circuit) 2420 filters a DC component of a signal from node1. Accordingly, when the output signal /OUT transitions from a low voltage level to a high voltage level in response to the input signal Din transitioning from a low voltage level to a high voltage level, the capacitor may output a positive AC voltage signal. The positive AC voltage signal which is output may be referred to as a dynamic bias voltage DBIAS.

When the dynamic bias voltage DBIAS is applied to the node node2 of the amplifier unit 2410, a first bias voltage VBIAS of a constant level may transition to a positive level instantaneously. The current mirror of the amplifier unit 2410 is implemented using a P-type transistor PMOS in which, as a voltage at a gate terminal, that is, a bias voltage increases, the magnitude of the first current I1 may decrease.

That is, components obstructing the flow of the second current I2 may be reduced by increasing the bias voltage at the node node2 to decrease the magnitude of the first current I1. By increasing the magnitude of the current flow of the second current I2, the amplified signal OUT output at the node node3 may transition from a high voltage level to a low voltage level at a high transition speed, enabling design of a flash memory that operates at a high speed even in a high frequency region.

A constant level at which the first bias voltage VBIAS is maintained may be referred to as "a first level", and a level of a changed bias voltage may be referred to as "a second level".

Referring to FIG. 8, a first amplifier 2411 and a second amplifier 2412 may be commonly connected to a node node3. Using the dual amplifier configuration shown in FIG. 8, an input buffer according to at least one example embodiment may allow for an amplified signal OUT to transition from the low level to the high level or from the high level to the low level at a high speed through the amplifiers.

A description of a configuration in which the first amplifier 2411, the second amplifier 2412, an amplifier unit 2410, an output unit 2430, and a dynamic bias voltage generating unit 2420 are connected to each other is omitted because the configuration is similar to that in FIG. 7. However, unlike the dynamic bias voltage generating unit 2420 including a single capacitor in FIG. 7, the dynamic bias voltage generating unit 2420 in FIG. 8 may include a first capacitor connected to a bias node node2 of the first amplifier 2411 and a second output node node1 and a second capacitor connected to a bias node node4 of the second amplifier 2412 and the second output node node1. The first capacitor and the second capacitor may be connected in parallel to each other.

When an input signal Din is maintained constant at a low voltage level or a high voltage level, a first current I1 of the P-type transistor of the current mirror in the first amplifier 2411 may be constant due to the bias voltage maintained at a constant level. A third current I3 of the N-type transistor of the current mirror in the second amplifier 2412 may be constant due to the bias voltage maintained at a constant level. Since the dynamic bias voltage generating unit 2420 does not pass a signal having a voltage maintained at a constant level, that is, a DC signal, the dynamic bias voltage generating unit 2420 may generate no dynamic bias voltage DBIAS when the bias voltages are maintained at a constant level.

Since, in the input unit of the first amplifier 2411, a gate voltage of the N-type transistor to which the input signal Din is input increases when the input signal Din transitions from a low voltage level to a high voltage level, the second current I2 flowing through the N-type transistor to which the input signal Din is input may increase. At this time, the dynamic bias voltage has not yet been provided to the node node2 of the first amplifier 2411 by the dynamic bias voltage generating unit 2420. Therefore, the first current I1 having a constant magnitude may still flow due to the bias voltage maintained at a constant level. The flow of the first current I1 may obstruct the flow of the second current I2.

An amplified signal OUT output at the node node3 has a phase opposite to the phase of the input signal Din. Thus, when the input signal transitions from a low level to a high level, the amplified signal transitions from a high level to a low level. In this case, the flow of the second current I2 obstructs the flow of the first current I1, thereby reducing a level transition speed of the amplified signal OUT.

In a case where the input signal Din transitions from a high voltage level to a low voltage level, as the gate voltage of the P-type transistor to which the input signal Din is input of the input unit of the second amplifier 2412 increases, the third current I3 flowing through the P-type transistor to which the input signal Din is input may decrease. At this time, the dynamic bias voltage DBIAS has not yet been provided to the node node4 of the second amplifier 2412 by the dynamic bias voltage generating unit 2420. Therefore, the fourth current I4 having a constant magnitude may still flow due to the bias voltage maintained at a constant level. As described above, by increasing the magnitude of the first current I4 the second amplifier 2412 may change the amplified signal from a high level to a low level at a high transition speed.

The amplified signal OUT which is output from the amplifier unit 2410 at the node node3 may be input to the output unit 2430. The output unit 2430 may invert the phase of the amplified signal OUT and output an output signal /OUT at the node node1. Furthermore, the output unit 2430 may further include one or more resistors connected in parallel to the inverters, thereby providing a signal that may mitigate PVT variation and improve signal quality using a negative feedback effect.

The output signal /OUT having the same phase as the input signal Din may be input to the dynamic bias voltage generating unit 2420. A capacitor of the dynamic bias voltage generating unit 2420 minimizes a loss in a high frequency region and outputs a signal. A DC component of the signal from node1 does not pass through the capacitor, whereas an AC component of the signal from node1 easily passes through the capacitor.

Accordingly, when the output signal /OUT transitions from a low voltage level to a high voltage level in response to the input signal Din transitioning from a low voltage level to a high voltage level, the capacitor may output a positive AC voltage signal. The positive AC voltage signal which is output may be referred to as a dynamic bias voltage DBIAS.

When the dynamic bias voltage DBIAS is applied to the node node2 of the first amplifier 2411 of the amplifier unit 2410, a first bias voltage VBIAS of a constant level may transition to a positive level instantaneously. The current mirror of the first amplifier 2411 is implemented using a P-type transistor PMOS in which, as a voltage at a gate terminal of the P-type transistor (e.g., a bias voltage) increases, the magnitude of the first current I1 may decrease.

That is, components obstructing the flow of the second current I2 may be reduced by increasing the bias voltage at the node node2 to decrease the magnitude of the first current I1. By decreasing the magnitude of the current flow of the first current I1, the amplified signal OUT output at the node3 may transition from a high voltage level to a low voltage level at a high transition speed.

When the dynamic bias voltage DBIAS that is a positive AC voltage is applied to the node node4 of the second amplifier 2412 of the amplifier unit 2410, the first bias voltage VBIAS of a constant level changes to a positive level instantaneously. The current mirror of the second amplifier 2412 is implemented using a N-type transistor NMOS in which, as a voltage at a gate terminal of the N-type transistor (e.g., a bias voltage) increases, the magnitude of the fourth current I4 may increase. By increasing the magnitude of the fourth current I4, the amplified signal OUT output at the node node3 may transition from a high voltage level to a low voltage level at a high transition speed.

In a case where the input signal Din transitions from a low voltage level to a high voltage level, as the gate voltage of the P-type transistor to which the input signal Din is input of the input unit of the second amplifier 2412 decreases, the third current I3 flowing through the P-type transistor to which the input signal Din is input may increase. At this time, the dynamic bias voltage DBIAS has not yet been provided to the node node4 of the second amplifier 2412 by the dynamic bias voltage generating unit 2420. Therefore, the fourth current I4 having a constant magnitude may still flow due to the bias voltage maintained at a constant level. The flow of the fourth current I4 may obstruct the flow of the third current I3.

An amplified signal OUT output from the amplifier unit 2410 at the node3 has a phase opposite to the phase of the input signal Din. Thus, when the input signal Din transitions from a low level to a high level, the amplified signal OUT may transition from a high level to a low level. At this time, the flow of the fourth current I4 obstructs the flow of the third current I3, reducing a level transition speed of the amplified signal OUT.

Since, in the input unit of the first amplifier 2411, the gate voltage of the N-type transistor to which the input signal Din is input decreases, the second current I2 flowing through the P-type transistor may decrease. At this time, the dynamic bias voltage DBIAS has not yet been provided to the node node2 of the first amplifier 2411 by the dynamic bias voltage generating unit 2420. Therefore, the first current I1 having a constant magnitude may still flow due to the bias voltage maintained at a constant level. By increasing the magnitude of the first current I1, the amplified signal OUT output by the second amplifier 2412 may have a high transition speed when transitioning from a low level to a high level.

The amplified signal OUT which is output from the amplifier unit 2410 at the node3 may be input to the output unit 2430. The output unit 2430 may invert the phase of the amplified signal OUT and output an output signal /OUT at the node node1. The output signal /OUT having the same phase as the input signal Din may be input to the dynamic bias voltage generating unit 2420.

Accordingly, when the output signal /OUT transitions from a high voltage level to a low voltage level in response to the input signal Din transitioning from a high voltage level to a low voltage level, the capacitor may output a negative AC voltage signal as the dynamic bias voltage DBIAS.

When the dynamic bias voltage DBIAS that is the negative AC voltage is applied to the node node4 of the second amplifier 2412 of the amplifier unit 2410, a first bias voltage VBIAS of a constant level may transition to a negative voltage level instantaneously. The current mirror of the second amplifier 2412 is implemented using a N-type transistor NMOS in which, as a voltage at a gate terminal of the N-type transistor (e.g., a bias voltage) decreases, the magnitude of the fourth current I4 may decrease.

That is, components obstructing the flow of the third current I3 may be reduced by decreasing the bias voltage at the node node4 to decrease the magnitude of the fourth current I4. By decreasing the magnitude the current flow of the fourth current I4, the amplified signal OUT output at the node node3 may transition from a low voltage level to a high voltage level at a high transition speed.

When the dynamic bias voltage DBIAS that is the positive AC voltage is applied to the node node2 of the first amplifier 2411 of the amplifier unit 2410, the first bias voltage VBIAS of a constant level may transition to a positive voltage level instantaneously. The current mirror of the first amplifier 2411 is implemented using a P-type transistor PMOS in which, as a voltage at a gate terminal of the P-type transistor (e.g., a bias voltage) decreases, the magnitude of the first current I1 may increase.

That is, by increasing the magnitude of the first current I1, the amplified signal OUT output at the node node3 may transition from a low voltage level to a high voltage level at a high speed. By increasing a transition speed of the output signal /OUT which is output from the output unit 2430 and has the same phase as the input signal Din as described above, a flash memory may be designed which operates at a high speed, even in a high frequency region. A constant level of a first bias voltage VBIAS may be referred to as "a first level, and a level of a changed bias voltage may be referred to as "a second level".

Figure 9:
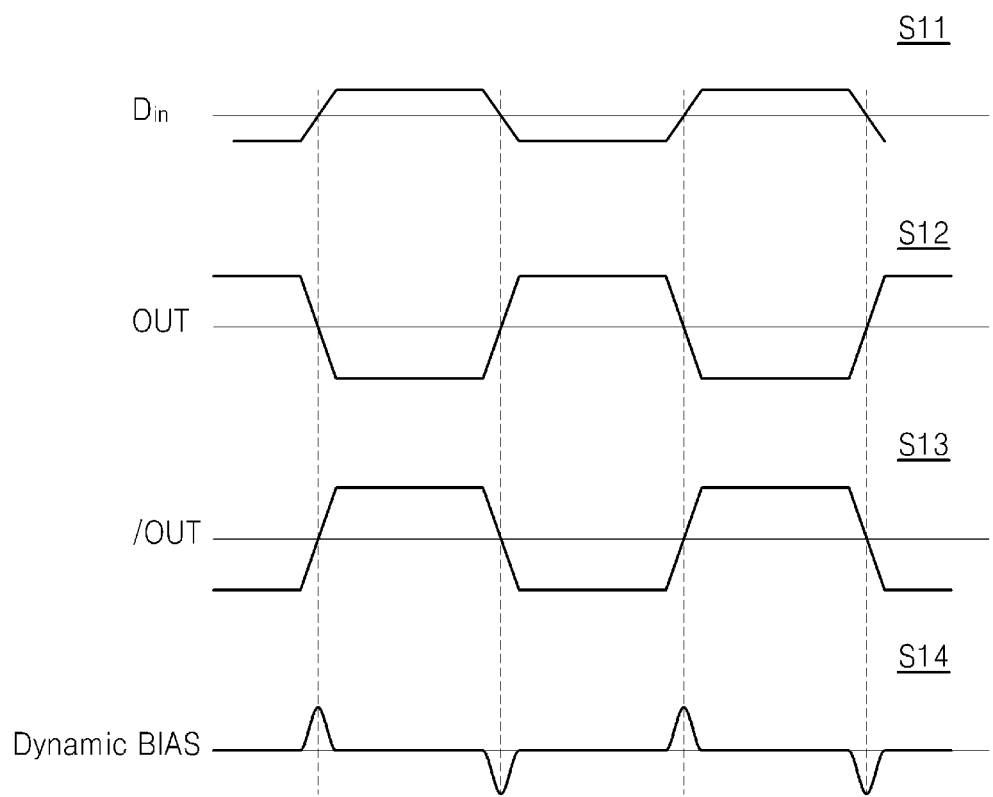
FIG. 9 is a waveform diagram illustrating level changes in an input signal, an amplified signal, an output signal, and a dynamic bias voltage according to at least one example embodiment of the inventive concepts.

FIG. 9 is a diagram illustrating level changes in an input signal Din, an amplified signal OUT, an output signal /OUT, and a dynamic bias voltage DBIAS.

Referring to FIG. 9, signal S11 illustrates a level change in the input signal Din, signal S12 illustrates a level change in the amplified signal OUT, signal S13 illustrates a level change in the output signal /OUT, and signal S14 illustrates a level change in the dynamic bias voltage DBIAS.

As described above, the amplified signal OUT may have a phase opposite to the phase of the input signal Din according to characteristics of the amplifier. The output signal /OUT may have the same phase as the input signal when the output unit inverts the amplified signal OUT.

In the case of the dynamic bias voltage DBIAS, the dynamic bias voltage DBIAS may be generated to be a positive AC voltage when the output signal /OUT transitions from a low voltage level to a high voltage level. When the output signal /OUT is maintained at a high level or a low level for a desired (or alternatively, predetermined) period of time, the dynamic bias voltage DBIAS may not be generated.

When the output signal /OUT transitions from a high voltage level to a low voltage level, the dynamic bias voltage DBIAS may be generated to be a negative AC voltage.

As a result, when the output signal /OUT transitions from a low voltage level to a high voltage level, the dynamic bias voltage DBIAS is provided to the amplifier unit to allow the bias voltage maintained at a constant level to have a positive value. When the output signal /OUT transitions from the high voltage level to the low voltage level, the dynamic bias voltage DBIAS is provided to the amplifier unit, allowing the bias voltage maintained at a constant level to have a negative value.

Figure 10:
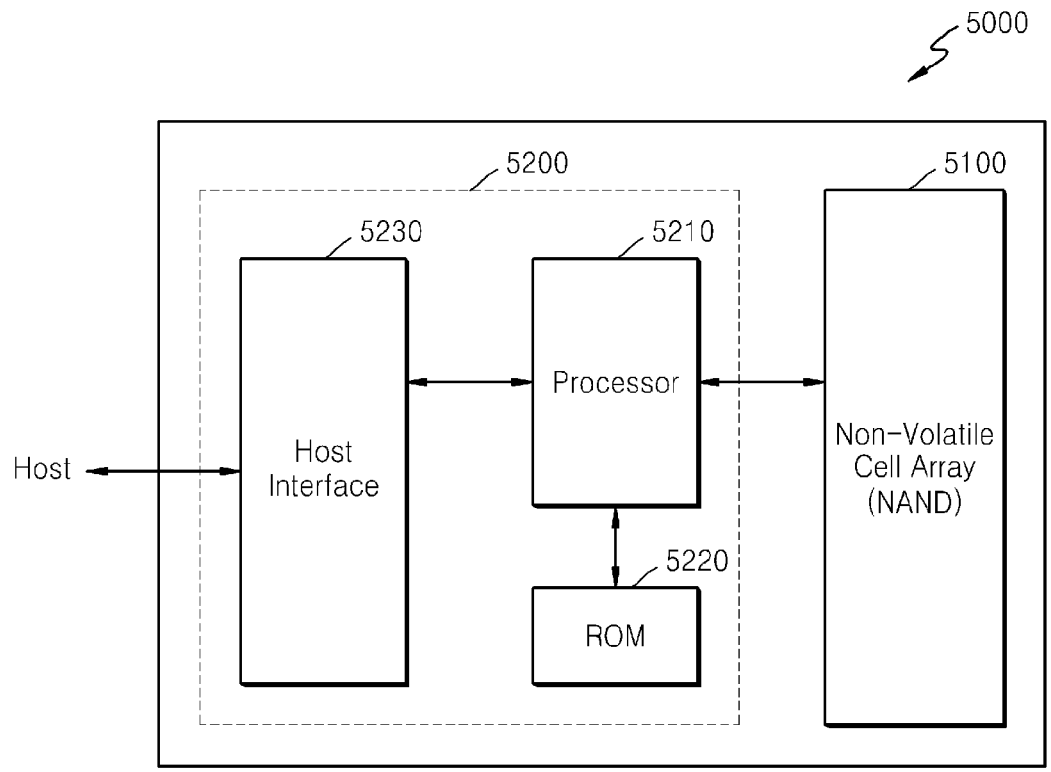
FIG. 10 is a block diagram illustrating a non-volatile memory device according to at least one example embodiment of the inventive concepts.

FIG. 10 is a block diagram illustrating a non-volatile memory device according to at least one example embodiment of inventive concepts. Here, the inventive concepts may be applicable to the non-volatile memory device 5000. Data may be written to, stored in, and read from the non-volatile memory device 5000 when an external host accesses the non-volatile memory device 5000. The above-described inventive concepts may be implemented in the non-volatile memory device 5000. The non-volatile memory device 5000 according to at least one example embodiment of the inventive concepts may include a non-volatile cell array 5100 that stores data, a ROM 5220 that stores a program, a processor 5210 that executes the program for managing the non-volatile memory device, and a host interface 5230 that transmits and receives signals to and from the external host. The controller 5200 that manages the non-volatile cell array 5100 may include the processor 5210, the ROM 5220, and the host interface 5230.

An input buffer that includes an amplifier unit, an output unit, and a dynamic bias voltage generating unit according to above described example embodiments of the inventive concepts may be included in the host interface 5230, and the host interface 5230 may receive commands and addresses from a host. The processor 5210 may receive data which is stored in the ROM 5220 and is for execution of the program for management of the non-volatile memory device 5000. In this case, the input buffer according to above described example embodiments of the inventive concepts may be included in the processor 5210.

The non-volatile cell array 5100 may include a cell array, such as a NAND flash memory or a NOR flash memory.

Figure 11:
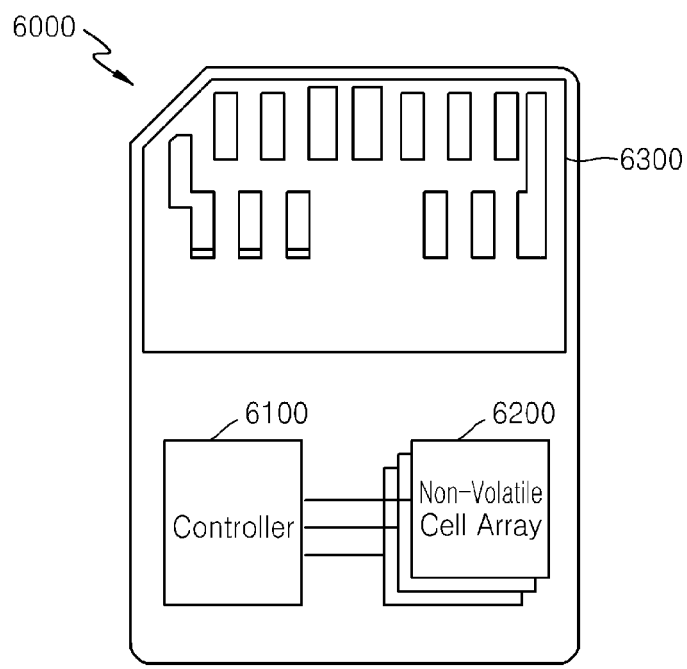
FIG. 11 is a diagram illustrating a memory card according to at least one example embodiment of the inventive concepts.

FIG. 11 is a diagram illustrating a memory card according to at least one example embodiment of the inventive concepts. The memory card 6000 may be a portable storage device which may be used when connected to an electronic device, such as a mobile device or a desktop computer. Referring to FIG. 11, the memory card 6000 may include a controller 6100, a non-volatile cell array 6200, and a port 6300.

The memory card may communicate with an external host (not illustrated) through the port 6300. The controller 6100 may control the non-volatile cell array 6200. The controller 6100 may read a program from a ROM (not illustrated) that stores programs and may execute the program. The input buffer that includes an amplifier unit, an output unit, and a dynamic bias voltage generating unit according to above described example embodiments of the inventive concepts may be included in the controller 6100 and may achieve a high operation speed when reading a program from the ROM. The non-volatile cell array 6200 may include a cell array, such as a NAND flash memory or a NOR flash memory.

According to at least one example embodiment of the inventive concepts, the non-volatile memory may include a Magnetic Random Access Memory (MRAM), a Resistance RAM (RRAM), a Ferroelectric RAM (FRAM), a Phase Change Memory (PCM), etc.

Figure 12:
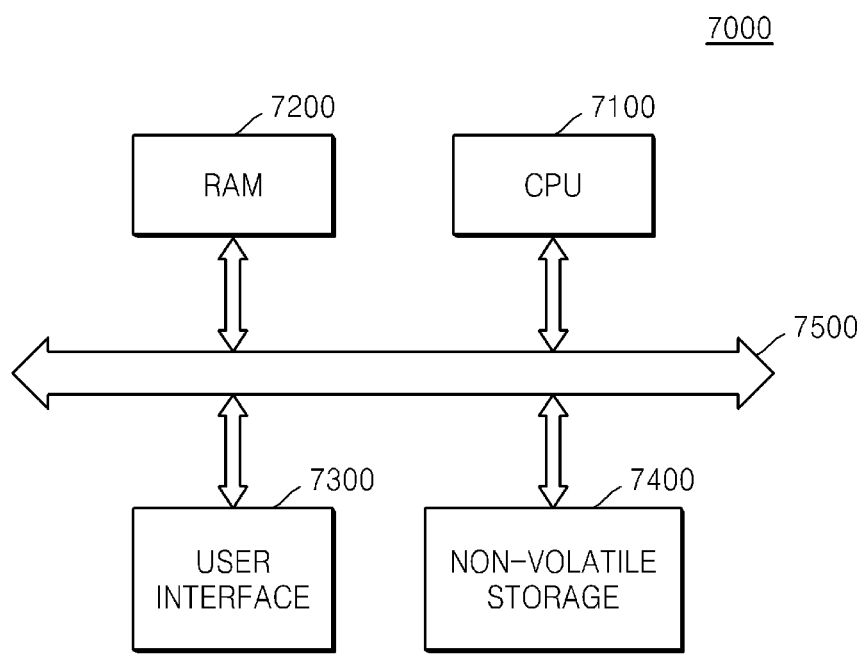
FIG. 12 is a block diagram illustrating a computing system including a non-volatile memory device according to at least one example embodiment of the inventive concepts.

FIG. 12 is a block diagram illustrating a computing system including a non-volatile memory device according to at least one example embodiment of the inventive concepts. The non-volatile memory device may be mounted in the computing system 7000, such as a mobile device or a desktop computer. The computing system may include a non-volatile storage 7400. The non-volatile storage 7400 may be a non-volatile memory device may be implemented using any one or more of the above-described example embodiments.

The computing system 7000 according to the at least one example embodiment of the inventive concepts includes a central processing unit (CPU) 7100, a RAM 7200, a user interface 7300, and the non-volatile storage 7400, all of which are electrically connected to a bus 7500. In the computing system 7000, the non-volatile storage 7400 may include a non-volatile memory device (not illustrated) that stores data. The non-volatile memory device may include a non-volatile cell array (not illustrated) and a controller (not illustrated) that manages the non-volatile cell array. The controller may perform the method of managing a non-volatile memory device according to an at least one example embodiment of the inventive concepts. The non-volatile cell array included in the non-volatile storage 7400 may include a cell array, such as a NAND flash memory or a NOR flash memory.

Figure 13:
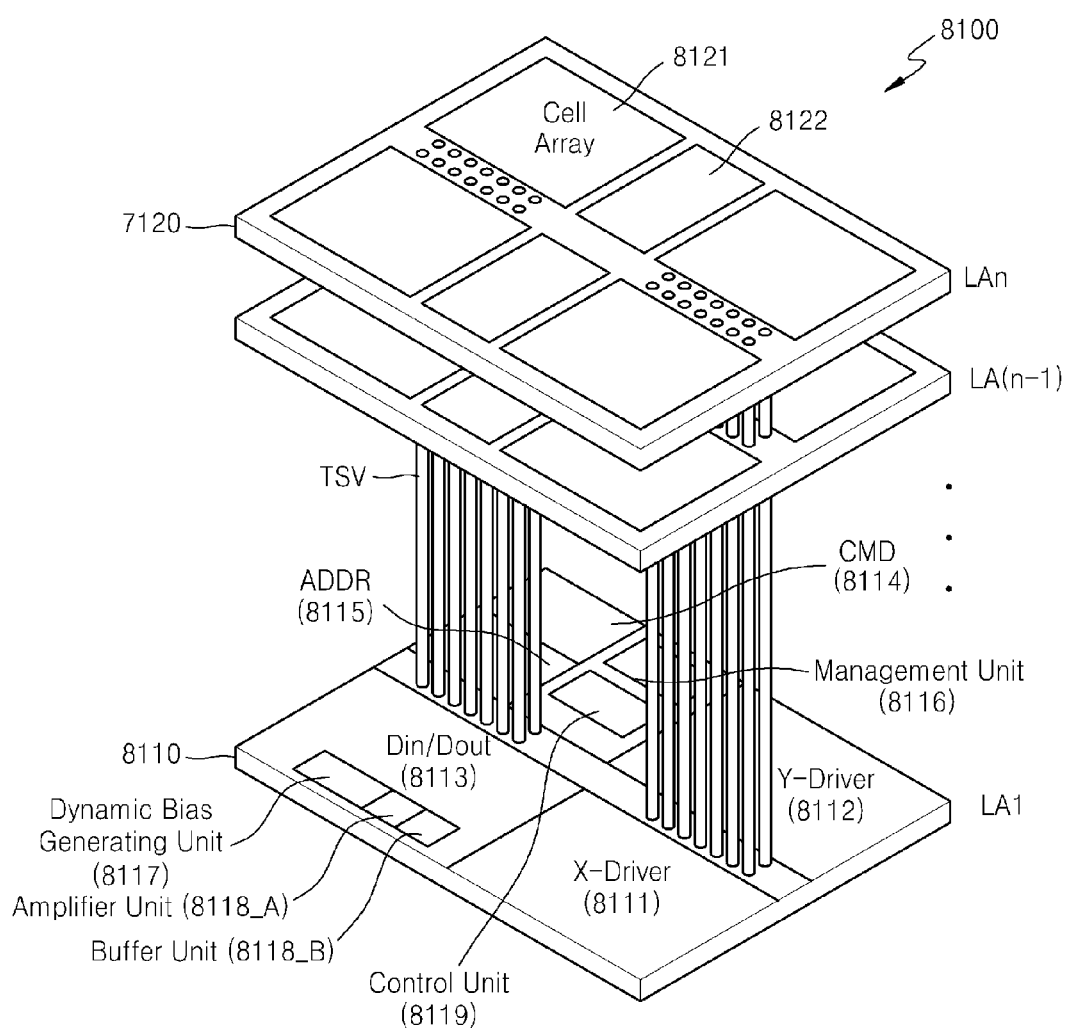
FIG. 13 is a configuration diagram illustrating a semiconductor memory device according to at least one example embodiment of the inventive concepts.

FIG. 13 is a configuration diagram illustrating a semiconductor memory device according to at least one example embodiment of the inventive concepts. FIG. 13 illustrates an example of the semiconductor memory device which is implemented by a plurality of stacked semiconductor layers.

Referring to FIG. 13, the semiconductor memory device 8100 may include a plurality of semiconductor layers LA1 to LAn. Each of the semiconductor layers LA1 to LAn may be a memory chip including an non-volatile memory cell array. One of the semiconductor layers LA1 to LAn may be a master chip that interfaces with an external controller, and the remaining semiconductor layers may be slave chips that store data. In the example embodiment shown in FIG. 13, it is assumed that the semiconductor layer LA1 disposed at a lowest position is a master chip and the remaining semiconductor layers are slave chips.

The plurality of semiconductor layers LA1 to LAn transmit and receive signals to and from one other through through-silicon-vias TSVs. The master chip LA1 communicates with an external memory controller (not illustrated) through a conductive portion (not illustrated) formed in an outer surface thereof. The configuration and operation of the semiconductor memory device 8100 are described below with respect to the first semiconductor layer 8110 operating as a master chip and the n-th semiconductor layer 8120 operating as a slave chip.

The first semiconductor layer 8110 includes various circuits that drive a cell array 8121 provided in each of slave chips. For example, the first semiconductor layer 8110 may include a row driver X-Driver 8111 that drives a word line of the cell array 8121, a column driver Y-Driver 8112 that drives a bit line of the cell array 8121, a data buffer 8113 that controls input and output of data, a command buffer 8114 that buffers a command signal CMD from the outside, and an address buffer 8115 that receives and buffers an address signal ADDR. According to at least one example embodiment of the inventive concepts, at least one of the data buffer 8113, the command buffer 8114, and the address buffer 8115 includes a dynamic bias voltage generating unit, which may be used during operation in a high frequency region. For example, as illustrated in FIG. 13, the data buffer 8113 may include a dynamic bias voltage generating unit 8117 that generates a dynamic bias voltage and provides the dynamic bias voltage to an amplifier unit 8118_A, the amplifier unit 8118_A that amplifies a difference between a data input signal and a reference voltage, and an output unit 8118_B that inverts an amplified signal and outputs an output signal which mitigates (or alternatively, prevents) the effects of PVT variation.

In addition, the first semiconductor layer 8110 may further include a non-volatile memory management unit 8116 that manages memory operations of the slave chip. The non-volatile memory management unit 8116 may include an input buffer with a dynamic bias voltage generating unit for precise operation with respect to the data input signal received from a ROM (not illustrated). The n-th semiconductor layer 8120 may include a cell array 8121 and a peripheral circuit region 8122 in which other peripheral circuits driving the cell array 8121, for example, a row/column selection unit selecting a row and a column and a bit line sense amplifier, are arranged.

While the inventive concepts have been particularly shown and described with reference to example embodiments thereof, it will be understood that various changes in form and details may be made therein without departing from the spirit and scope of the following claims.

What is claimed is:

1. An input buffer, comprising:
   an amplifier circuit configured to amplify an input signal and output an amplified signal to a first output node, the input signal being amplified according to a first bias voltage set, at a bias node, to a first level based on a power supply voltage and a reference voltage;
   an output circuit configured to receive and buffer the amplified signal and output an output signal to a second output node; and
   a dynamic bias voltage generator configured to change the first bias voltage to a second level in response to a transition of the output signal.

2. The input buffer of claim 1, wherein the amplifier circuit includes at least one amplifier that is configured to receive the input signal and the reference voltage and amplify a difference between the input signal and the reference voltage to generate the amplified signal.

3. The input buffer of claim 2, wherein the amplifier circuit comprises:
   a current mirror including at least two transistors configured to operate as a constant-current source;
   an input circuit including at least two transistors configured to receive the input signal and the reference voltage, respectively; and
   a first output node configured to output a node voltage, as the amplified signal, according to a first current supplied from the current mirror and a second current flowing through the transistor that receives the input signal in the input circuit.

4. The input buffer of claim 3, wherein the at least two transistors in the input circuit are of a first transistor type, and the at least two transistors in the current mirror are of a second transistor type different from the first transistor type.

5. The input buffer of claim 1, wherein if the output signal is constant, the dynamic bias voltage generator is configured to change the bias voltage from the second level to the first level.

6. The input buffer of claim 1, wherein the amplifier circuit comprises:
   a first amplifier including a first current mirror and a first input circuit, the first current mirror including a diode-connected PMOS transistor, the first input circuit including at least two NMOS transistors gated by the input signal and the reference voltage, respectively; and
   a second amplifier including a second current mirror and a second input circuit, the second current mirror including a diode-connected NMOS transistor, the second input circuit including at least two PMOS transistors gated by the input signal and the reference voltage, respectively, wherein,
   the output circuit is connected to the first output node,
   the first output node is connected to the first and second amplifiers,
   the output circuit includes resistors and an odd number of inverters, and the resistors are connected in parallel to the inverters, and
   the dynamic bias generator includes a capacitor connected between the second output node and a bias node of one of the first and second amplifiers.

7. The input buffer of claim 1, wherein the output circuit includes at least one inverter connected to the first output node, and
   wherein the output circuit is configured to receive the amplified signal from the amplifier circuit, and output the output signal such that a phase of the output signal is opposite to a phase of the amplified signal.

8. The input buffer of claim 1, wherein the dynamic bias voltage generator includes at least one capacitor connected in parallel between the bias node and the second output node.

9. The input buffer of claim 1, wherein, if the input signal transitions from a logic low level to a logic high level, the dynamic bias voltage generator is configured to generate a positive dynamic bias voltage and provide the positive dynamic bias voltage to the amplifier circuit.

10. The input buffer of claim 9, wherein the positive dynamic bias voltage is an AC voltage, and the dynamic voltage bias generator is configured to apply the AC voltage to the bias node to change the first bias voltage.

11. The input buffer of claim 1, wherein, if the input signal transitions from a logic high level to a logic low level, the dynamic bias voltage generator is configured to generate a negative dynamic bias voltage and provide the negative dynamic bias voltage to the amplifier circuit.

12. A flash memory device, comprising:
   a clock buffer configured to buffer a clock signal from a memory controller;
   a command buffer configured to buffer a command signal;

an address buffer configured to buffer an address signal; and a data buffer configured to buffer a data signal, wherein at least one of the clock buffer, the command buffer, the address buffer and the data buffer includes, an amplifier circuit configured to amplify an input signal and output an amplified signal to a first output node, the input signal being amplified according to a first bias voltage set, at a bias node, to a first level based on a power supply voltage and a reference voltage, an output circuit configured to receive and buffer the amplified signal and output an output signal to a second output node, and a dynamic bias voltage generator configured to change the first bias voltage to a second level in response to a transition of the output signal.

13. The flash memory device of claim 12, wherein the amplifier circuit comprises:

a current mirror including at least two transistors configured to operate as a constant-current source;

an input circuit including at least two transistors configured to receive the input signal and the reference signal, respectively; and a first output node configured to output a node voltage, as the amplified signal, according to a first current supplied from the current mirror and a second current flowing through the transistor that receives the input signal in the input circuit.

14. The flash memory device of claim 12, wherein the dynamic bias voltage generator includes at least one capacitor connected in parallel between the bias node and the second output node.

15. The flash memory device of claim 12, wherein if the input signal transitions from a logic low level to a logic high level, at least one of the clock buffer, the command buffer, the address buffer and the data buffer is configured to generate a positive dynamic bias voltage and provide the positive dynamic bias voltage to the current mirror to increase the first bias voltage from the first level to a higher level than the first level, and if the input signal transitions from the logic high level to the logic low level, at least one of the clock buffer, the command buffer, the address buffer and the data buffer is configured to generate a negative dynamic bias voltage and provide the negative dynamic bias voltage to the current mirror to decrease the first bias voltage from the first level to a lower level than the first level.

16. An input buffer, comprising:

at least one amplifier configured output an amplified signal to an output node, the amplified signal being amplified according to a bias voltage set, at a bias node, based on a power supply signal, an input signal, a reference signal, and a filtered signal, the input signal having a first phase, the amplified signal having a second phase opposite to the first phase;

an output circuit configured to invert the amplified signal to output an output signal having the first phase; and a filter circuit configured to apply the filtered signal to the at least one amplifier by filtering a component of the output signal.

17. The input buffer of claim 16, wherein the at least one amplifier includes a current mirror and an input circuit, the current mirror being configured to generate a current based on the reference signal, the input signal, and the filtered signal, and wherein the filtered component is a direct current (DC) component.

18. The input buffer of claim 17, wherein the filter circuit is configured to, apply the filtered signal to the at least one amplifier as a positive voltage signal if the input signal transitions from a logic low level to a logic high level, and apply the filtered signal to the at least one amplifier as a negative voltage signal if the input signal transitions from a logic high level to a logic low level.

19. The input buffer of claim 16, wherein the filter circuit is configured to apply the filtered signal to the at least one amplifier during a time period in which the output signal transitions between logic levels.

20. The input buffer of claim 16, wherein the at least one amplifier is a plurality of amplifiers configured to output amplified signals to the output node, the amplified signals being based on the input signal and the reference signal.

* * * * *